United States Patent
Mifuji

[11] Patent Number: 5,195,235
[45] Date of Patent: Mar. 23, 1993

[54] PARTS MOUNTING APPARATUS

[75] Inventor: Fumio Mifuji, Kasai, Japan

[73] Assignee: Sanyo Electric Co., Ltd., Moriguchi, Japan

[21] Appl. No.: 708,139

[22] Filed: May 30, 1991

[30] Foreign Application Priority Data

May 31, 1990 [JP] Japan .................. 2-142304

[51] Int. Cl.$^5$ .............................. H05K 3/30
[52] U.S. Cl. ..................... 29/721; 29/740; 29/743
[58] Field of Search ......... 29/720, 721, 740, 743, 29/205, 714–719, 833

[56] References Cited

U.S. PATENT DOCUMENTS

| | | |
|---|---|---|
| 4,624,050 | 11/1986 | Hawkswell . |
| 4,675,993 | 6/1987 | Harada . |
| 4,770,599 | 9/1988 | Hawkswell . |
| 4,831,721 | 5/1989 | Hirai et al. . |
| 4,951,383 | 8/1990 | Amao et al. ........................ 29/721 |

FOREIGN PATENT DOCUMENTS

| | | |
|---|---|---|
| 0253228 | 1/1988 | European Pat. Off. . |
| 0257553 | 3/1988 | European Pat. Off. . |
| 0286178 | 10/1988 | European Pat. Off. . |
| 58-213496 | 12/1983 | Japan . |
| 59-29492 | 2/1984 | Japan . |
| 59-69992 | 4/1984 | Japan . |
| 62-111496 | 5/1987 | Japan . |
| 62-52960 | 11/1987 | Japan . |
| 63-16700 | 1/1988 | Japan . |
| 63-178597 | 7/1988 | Japan . |
| 1-121138 | 5/1989 | Japan . |
| 2169422A | 7/1986 | United Kingdom . |

Primary Examiner—Carl E. Hall
Attorney, Agent, or Firm—Nikaido, Marmelstein, Murray & Oram

[57] ABSTRACT

A parts mounting apparatus includes a structure (34) on which a spindle (31) is supported to be movable up and down, and the spindle has a vacuum suction path (36). Either a normal nozzle (50) or a nozzle for image recognition (141) can be attached to a lower end of the spindle. When the normal nozzle is attached to the spindle, parts positioning jaws (61a–62b) supported on the structure performs a centering operation of the parts sucked to the normal nozzle in accordance with vertical movement of the spindle by a cam device (90) and a motor (93). When the nozzle for image recognition is attached to the spindle, a CPU (201) controls the motor so that rise of the spindle can be stopped before the nozzle for image recognition enters an operating region of the jaws.

6 Claims, 15 Drawing Sheets

F I G. 1
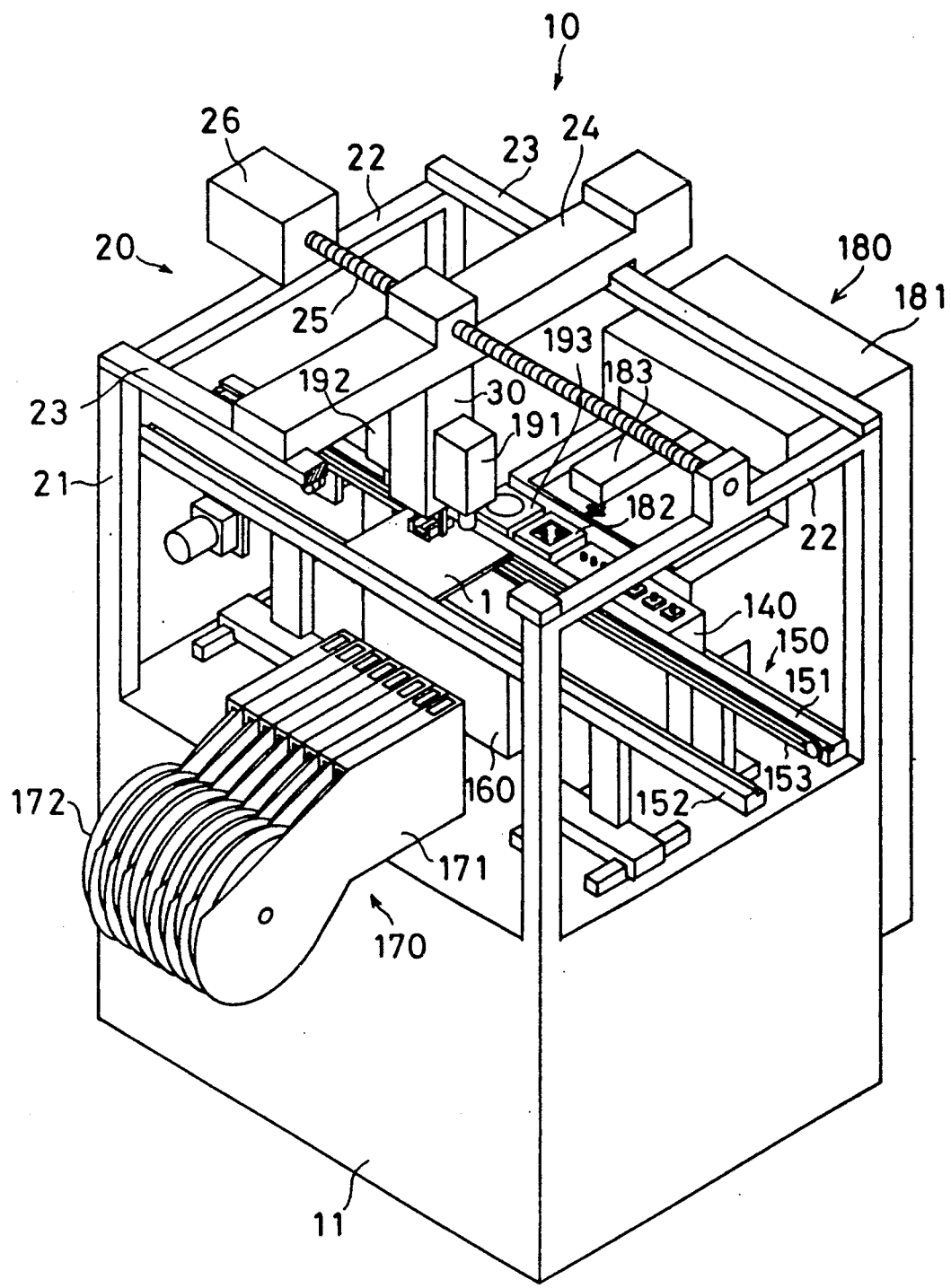

F I G. 17
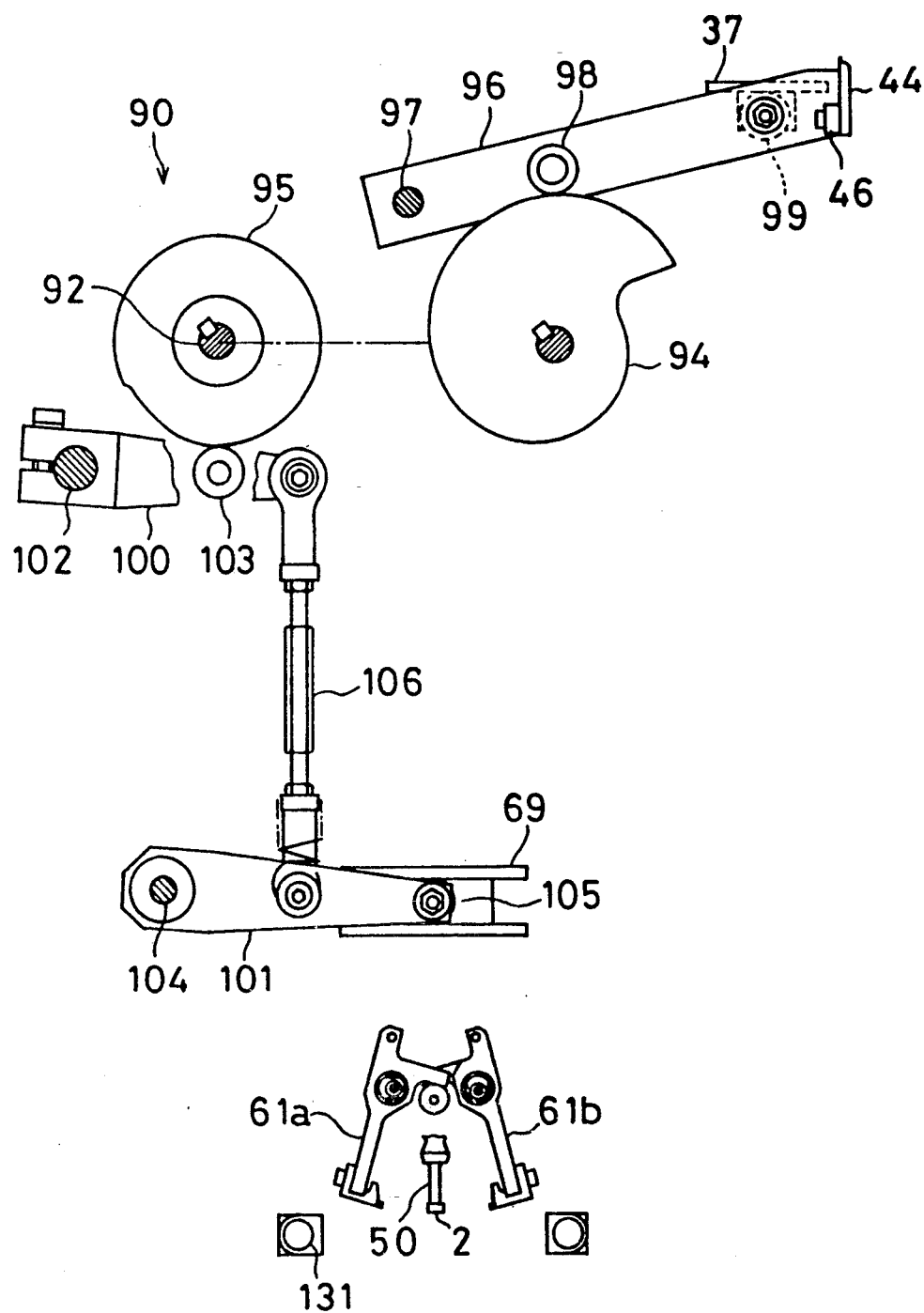

PARTS MOUNTING APPARATUS

BACKGROUND OF THE INVENTION

1. Field of the invention

The present invention relates to an apparatus for mounting surface mounting components onto a circuit board.

2. Description of the prior art

Vacuum suction type pick-and-place devices are generally used to mount surface mounting components onto a circuit board. Japanese Patent Laid-Open Gazette No. 63-178597 shows an example. The picked-up parts are often shifted in position and angle from the state proper position on the suction nozzle. Accordingly, even if the center of the nozzle coincides with the center of the land pattern of the board, the parts are not necessarily put on the right place. Therefore, the positions of the parts must be corrected before mounting. There are two ways of parts position correction. The first is correction of parts position and direction using jaws. Such a device is disclosed in Japanese Patent Laid-Open Gazette No. 63-178597. In this, device the nozzle and the jaws are respectively supported on different structures; the nozzle on a movable structure and the jaws on a immobile one. The device in Japanese Patent Laid-Open Gazette No. 62-111496 is a variation of this type, in which a nozzle and jaws are supported on one movable structure.

In the second method parts position correction is done by adjusting the positional relationship between the nozzle and the circuit board, not that of the nozzle and parts. In this method, it is necessary to know the position of the parts relative to the nozzle by image recognition. An example of this type of device is shown in Japanese Patent Laid-Open Gazette No. 58-213496.

Furthermore, devices with nozzle changeability to handle a wide variety of parts have been developed. Examples of this sort of machine are seen in documents such as Japanese Patent Laid-Open Gazette Nos. 59-69992, 63-16700 and 1-121138.

Therefore, a principle object of the present invention is to provide a novel parts mounting apparatus.

Another object of the present invention is to provide a parts mounting apparatus capable of selectively using normal nozzles and nozzles for image recognition.

Another object of the present invention is to provide a parts mounting apparatus having jaws on the nozzle-supporting structure to mechanically position parts held on a normal nozzle during nozzle travel. These jaws are kept inactive during the use of a nozzle for image recognition.

A parts mounting apparatus in accordance with the present invention comprises a spindle (31) vertically held and having a vacuum suction path (36) inside; a group nozzles (50, 141) selectively mounted on the lower end of said spindle and made to have communication with said vacuum suction path; a nozzle for image recognition (141) included in the above mentioned nozzle group; parts positioning jaws (61a, 61b, 62a, 62b) supported on a structure (34) for centering parts sucked by a normal nozzle with their tips, the same structure also supporting said spindle being able to move up-ward/downward; means (30, 90, 93, 201, 208) for applying to the spindle vertical motion for picking and placing the parts; means (30, 67, 201, 208) for causing said jaws open/close movement,; and means (30, 90, 93, 201, 208) for preventing the jaws from performing the centering operation.

The spindle with a normal nozzle is raised to the upper limit of the stroke after picking up a parts, and the jaws position the part. When a nozzle for image recognition is in the place of normal nozzle, the spindle ends its upward movement before it reaches the upper limit, and the nozzle for image recognition, which has no need for mechanical positioning of parts, does not enter the working area of jaws. Consequently, the parts positioning jaws do not perform a part centering operation when the nozzle for image recognition is used.

According to the present invention, a parts mounting apparatus can be used with a nozzle for image recognition being mounted on the head portion provided with parts positioning jaws, thereby the function of the machine is enhanced.

The objects and other objects, features, aspects and advantages of the present invention will become more apparent from the following detailed description of the embodiments of the present invention when taken in conjunction with accompanying drawings.

BRIEF DESCRIPTION OF THE DRAWINGS

FIG. 1 is a partially cutaway view in perspective showing a parts mounting apparatus of one embodiment in accordance with the present invention;

FIGS. 16 to 19 are diagrams showing the function of cams;

DETAILED DESCRIPTION OF THE PREFERRED EMBODIMENT

Overall Construction

Figure 2:
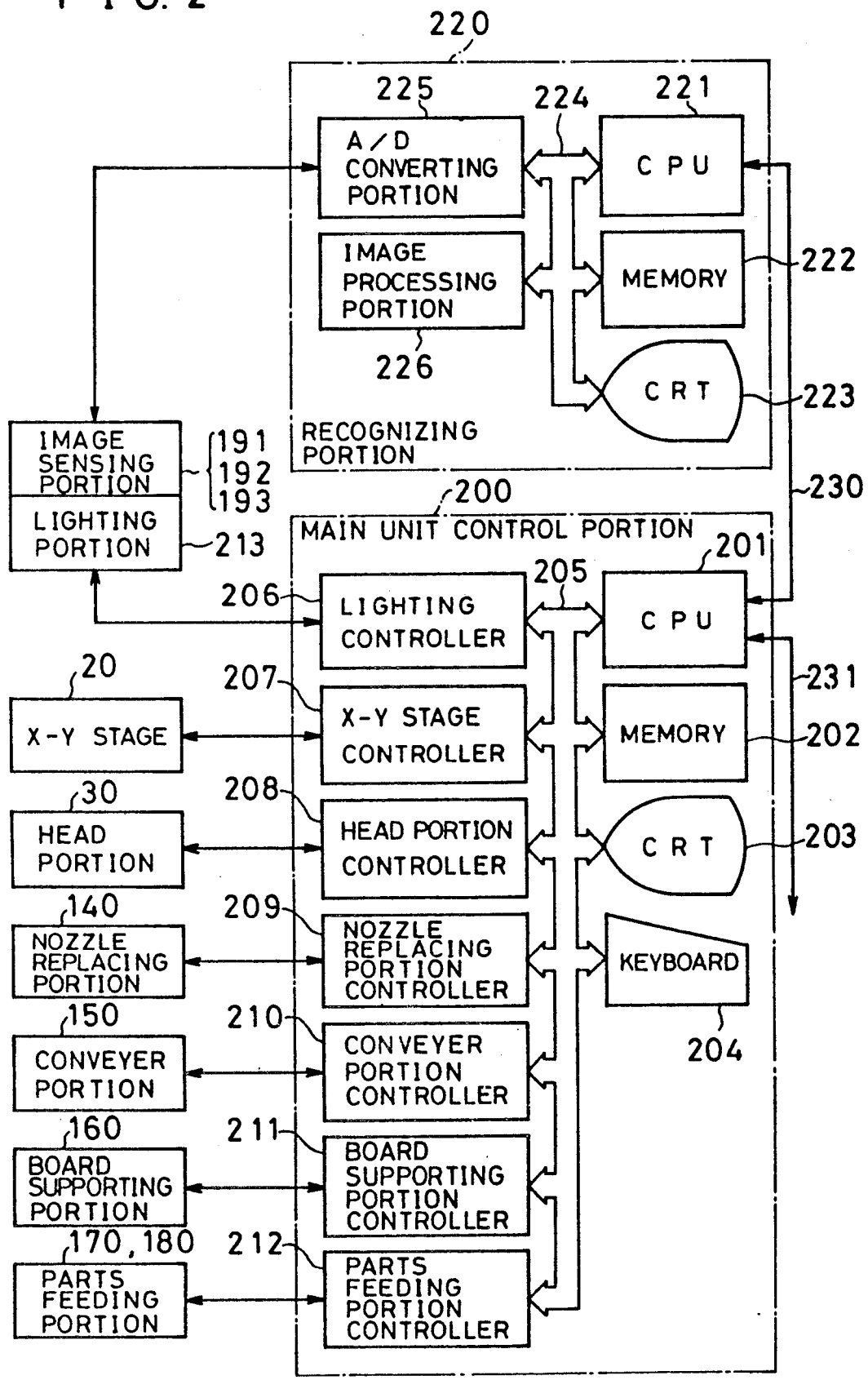
FIG. 2 is a block diagram showing a control system.

FIG. 1 shows schematic construction of a parts mounting apparatus 10. The parts mounting apparatus 10 has a box-shaped base 11. Constituent elements such as an X-Y stage 20, a head portion 30, a nozzle replacing portion 140, a conveyer portion 150, a board supporting portion 160, a first parts feeding portion 170 and so on are arranged on the base 11. Reference numeral 180 denotes a second parts feeding portion placed beside the base 11. A first image sensing portion 191 and a second image sensing portion 192 are attached to the head portion 30, and a third image sensing portion 193 is arranged beside the conveyer portion 150. The constituent elements will be described in detail.

X-Y Stage

The X-Y stage 20 is supported high above the base 11 by struts 21 raised from four corners of the base 11. Reference numerals 22 denote bridge portions forming a part of the X-Y stage 20, each of which connects upper ends of the two struts 21 to each other in the direction of a short side of the base 11. Reference numerals 23 denote linear slide guides similarly forming a part of the X-Y stage 20, each of which connects upper ends of the two struts 21 to each other in the direction of a long side of the base 11. Two linear slide guides 23 support an X-movable block 24. The X-movable block 24 is moved along the linear slide guides 23 by a ball screw 25 stretched between two bridge portions 22, and a motor 26 for rotating the ball screw 25. The X-movable block 24 contains a Y-movable block unit for moving the head portion 30 in the direction at right angles to the linear slide guides 23 with the head portion 30 being supported thereon. The Y-movable unit is also moved by the ball screw and the motor, similarly to the X-movable block 24.

Head Portion

Figure 3:
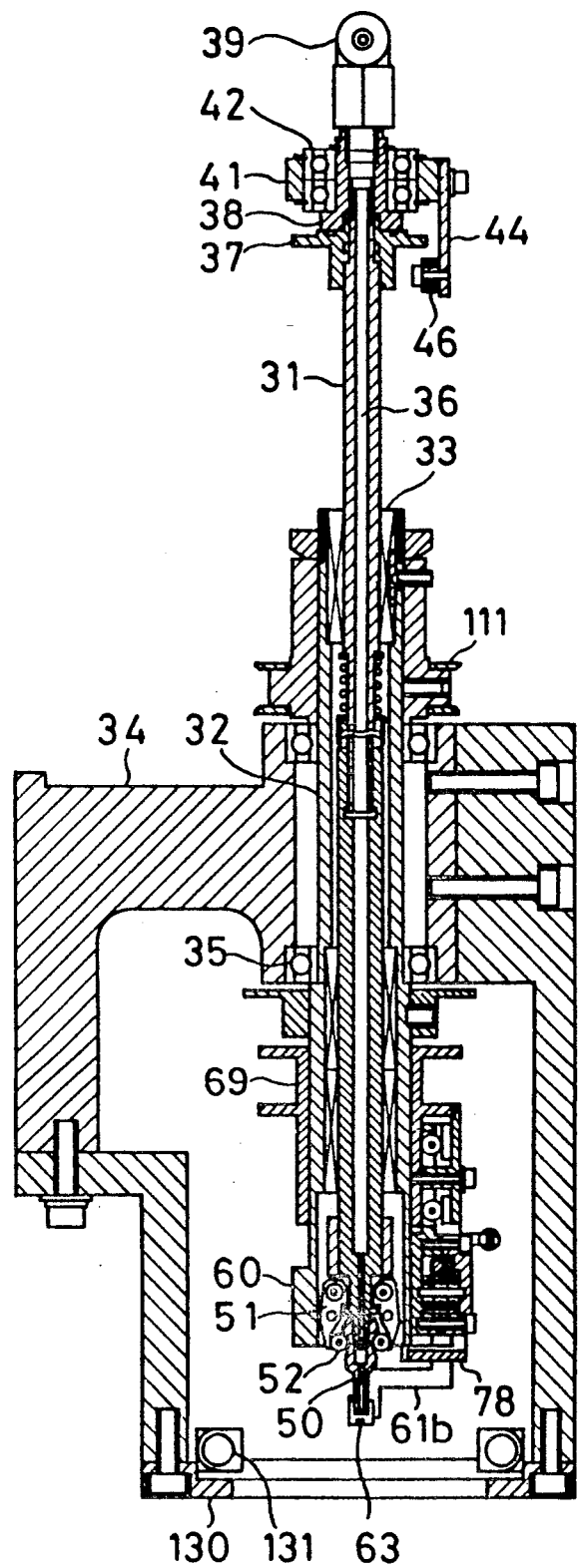
FIG. 3 is a cross sectional view showing major portions of a head portion.

The head portion 30 is supported with it being hung on the X-Y stage 20 and has in its cover part a mechanism shown in FIG. 3 and the subsequent drawings. More specifically, in FIG. 3, reference numeral 31 denotes a spindle vertically arranged, which is supported in the center of a hollow shaft 32 slidably in the axial direction, that is, movably up and down by a slide bearing 33. The hollow shaft 32 is rotatably supported through a bearing 35 in a frame structure 34. That is, the spindle 31 is movable up and down and rotatable and, is used for performing the picking and placing work of parts by the up-and-down movement and pointing the parts in a predetermined direction by the rotation. The mechanisms of the up-and-down movement and the rotation will be described later.

Figure 4:
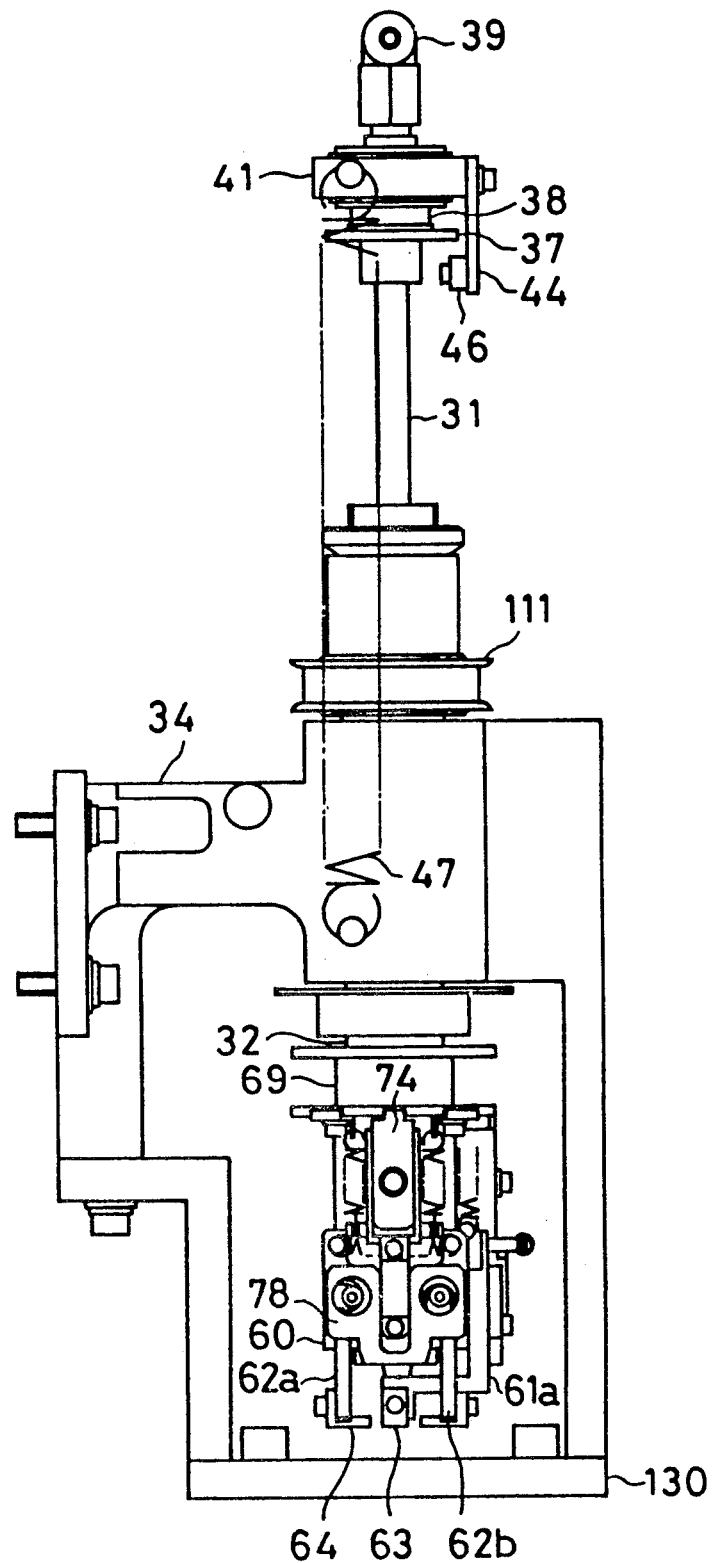
FIG. 4 is a side elevational view showing the portions shown in FIG. 3.
Figure 5:
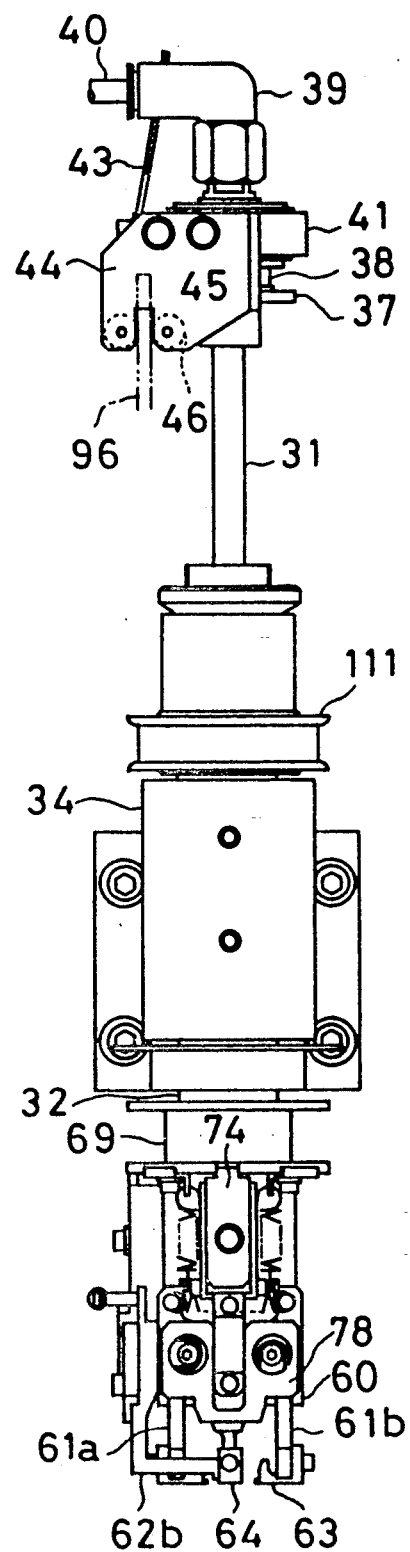
FIG. 5 is a side elevational view showing the portions shown in FIG. 3 as viewed in a direction at right angles to FIG. 4.

The spindle 31 is constructed by joining two upper and lower pipes together, and its central part is a vacuum suction path 36. A flange 37 and a joint holder 38 are fixed to an upper end of the spindle 31 in such a shape that they are stacked in this order. A rotary joint 39 is mounted on the joint holder 38, and a vacuum hose 40 horizontally extends from the rotary joint 39. The following elements are configured so as to keep the direction of the vacuum hose 40 constant, that is, so that the vacuum hose 40 is not rotated even if the spindle 31 is rotated. Ring 41 is arranged outside of the joint holder 38. A bearing 42 is interposed between the ring 41 and the joint holder 38. The ring 41 is rotatable relative to the joint holder 38. A stay 43 shown in FIG. 5 is fixed to the upper surface of the ring 41. The joint 39 penetrates the stay 43. Therefore, the ring 41 and the joint 39 are connected to each other so as not to be rotated. Reference numeral 44 denotes a plate-shaped bracket fixed to a side surface of the ring 41, which has a vertical groove 45 formed from its lower edge. Rollers 46 which are rotated about a horizontal shaft are attached to both sides of the groove 45. The rollers 46 sandwich a lever (described later) for lifting the flange 37 to stop the rotation of the ring 41 and thus, to stop the rotation of the joint 39. As shown in FIG. 4, a tension coil spring 47 is stretched between the ring 41 and the frame structure 34 to apply a downward force to the spindle 31.

A lower end of the spindle 31 is tapered, and a nozzle 50 is detachably fitted to the lower end. In addition, the vacuum suction path 36 is communicated to the nozzle 50. Reference numeral 51 denotes a pair of levers rotatably supported on outer surfaces of the spindle 31, which are used for engaging rollers 52 in their tip ends with a groove 53 on an outer surface of the nozzle 50 (see FIG. 13) to prevent the nozzle 50 from coming off. A tension coil spring 54 is stretched between the paired levers 51, which causes a force for elastically bringing the rollers 52 into contact with the nozzle 50 to be produced in the lever 51. The nozzle 50 can be replaced with another type of nozzle prepared in the nozzle replacing portion 140.

Figure 8:
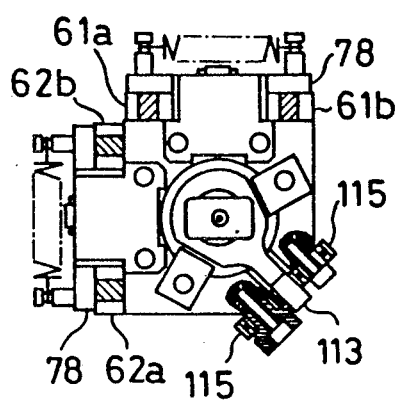
FIG. 8 is a bottom view showing the head portion, with parts positioning jaws being cut off and partially fractured.
Figure 9:
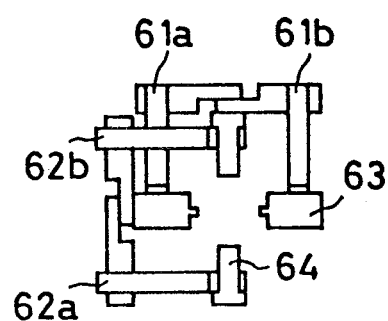
FIG. 9 is a bottom view showing only the parts positioning jaws.

A square mount base 60 as shown in FIG. 8 is formed in a lower end of the hollow shaft 32. Two pairs of parts positioning jaws 61a and 61b and 62a and 62b are rotatably supported on the mount base 60 to be swingable in a vertical plane, respectively. The situation where the parts positioning jaws 61a, 61b, 62a and 62b are arranged in a space is as shown in FIGS. 4, 5 and 9. More specifically, the pair of parts positioning jaws 61a and 61b and the pair of parts positioning jaws 62a and 62b are rotatably supported on two side surfaces at right angels to each other of the mount base 50, respectively. As a result, jaw tips 63 of the parts positioning jaws 61a and 61b and jaw tips 64 of the parts positioning jaws 62a and 62b respectively sandwich parts in the directions perpendicularly intersecting each other.

Figure 10:
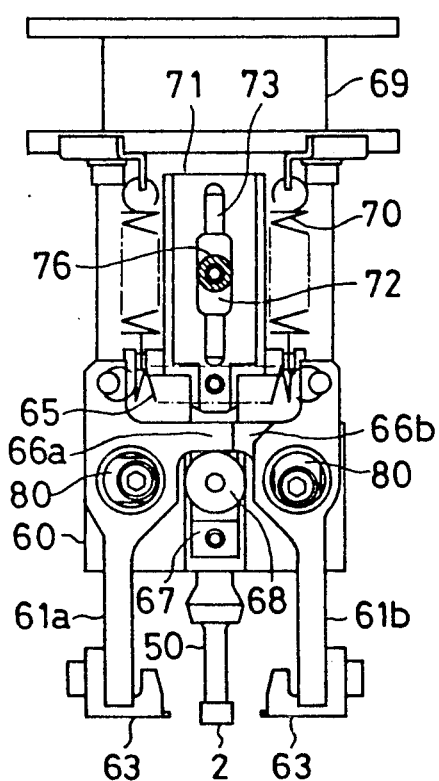
FIGS. 10 to 12 are partially front views showing opening and closing mechanisms of the pats positioning jaws and the movement thereof.
Figure 11:
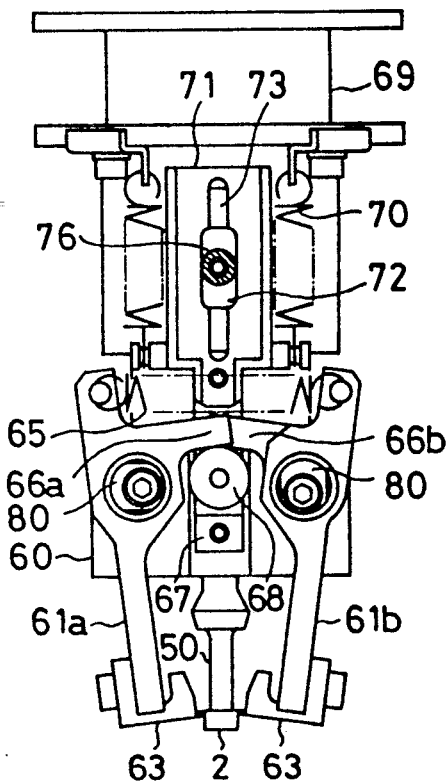
Figure 12:
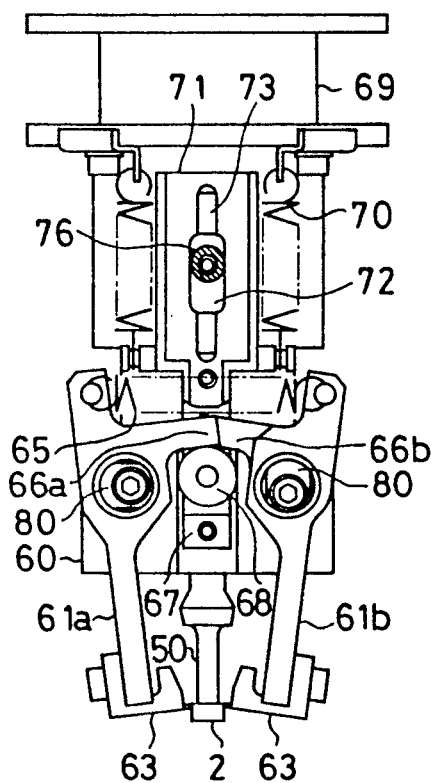
Figure 13:
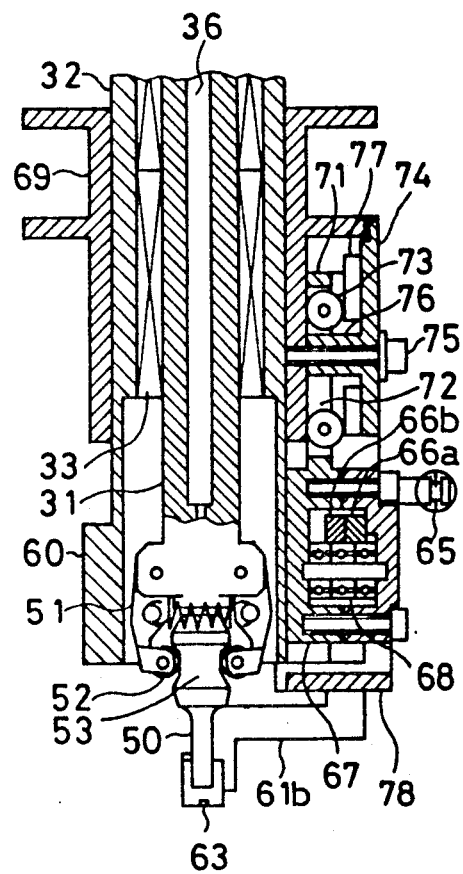
FIG. 13 is a partially sectional view presented for the same purpose as that of FIGS. 10 to 12.

The opening and closing mechanisms of the parts positioning jaws 61a, 61b, 62a and 62b are as follows. The opening and closing mechanisms of the parts positioning jaws 61a and 61b and 62a and 62b are the same and hence, only the opening and closing mechanisms of the parts positioning jaws 61a and 61b will be described herein. As shown in FIG. 10, a tension coil spring 65 is stretched in a position above the centers of swing of the parts positioning jaws 61a and 61b. Accordingly, the jaw tips 63 and 63 are urged in the direction where the same are separated from each other. Projection pieces 66a and 66b are formed also in a position above the centers of swing on opposed side surfaces of the parts positioning jaws 61a and 61b. The projection pieces 66a and 66b are overlapped with each other in the length direction of paper in FIG. 10, and a portion where the projection pieces are overlapped with each other is scooped up by a roller 68 of a slider 67. The jaw tips 63 and 63 are close to each other as shown in FIG. 11 when the slider 67 slides upward along an outer surface of the hollow shaft 32, while being separated from each other when the slider 67 is lowered. The slider 67 is slided by a flange cylinder 69 fitted on the outside of the hollow shaft 32. The flange cylinder 69 and the slider 67 are also connected to each other by a tension coil spring 70. Accordingly, when the flange cylinder 69 is pulled up, the slider 67 is also raised. As shown in FIG. 13, the slider 67 has an upward extending portion 71 which extends to an outer surface of the flange cylinder 69, and two rollers 73 are rotatably supported spaced apart from each other in the vertical direction in a long hole 72 in the longitudinal direction formed in the upward extending portion 71. Reference numeral 74 denotes a cover fixed to the flange cylinder 69 by a screw 75, which is fitted in a recess of the upward extending portion 71 and serves to maintain the slider 67 on the outer surface of the hollow shaft 32. The cover 74 has a leg portion 76 through which a screw 75 is passed. The leg portion 76 penetrates the long hole 72. An upper end of the cover 74 is engaged with the flange cylinder 69, thereby to prevent the cover 74 from being rotated about the screw 75. In addition, the rollers 73 are sandwiched between a projection portion 77 on the reverse surface of the cover 74 and the flange cylinder 69, to ensure the smooth movement of the slider 67. Reference numeral 78 shown in FIGS. 4 and 5 denotes a holder for preventing the parts positioning jaws 61a, 61b 62a and 62b from coming off.

Figure 14:
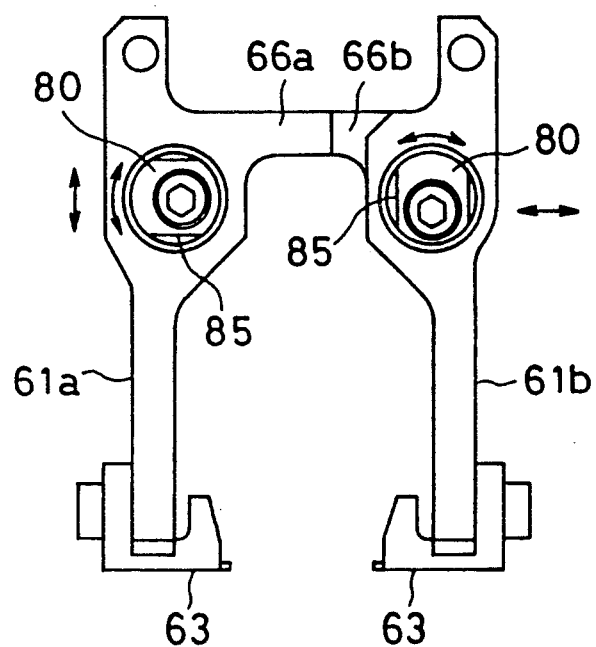
FIGS. 14 and 15 are a partially front view and a partially sectional view showing fine adjustment mechanisms of the parts positioning jaws.
Figure 15:
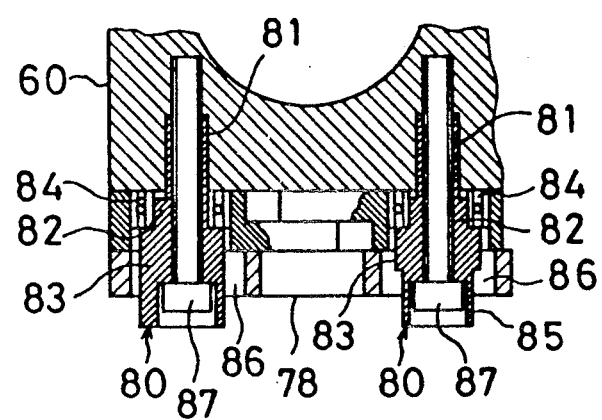
Figure 16:
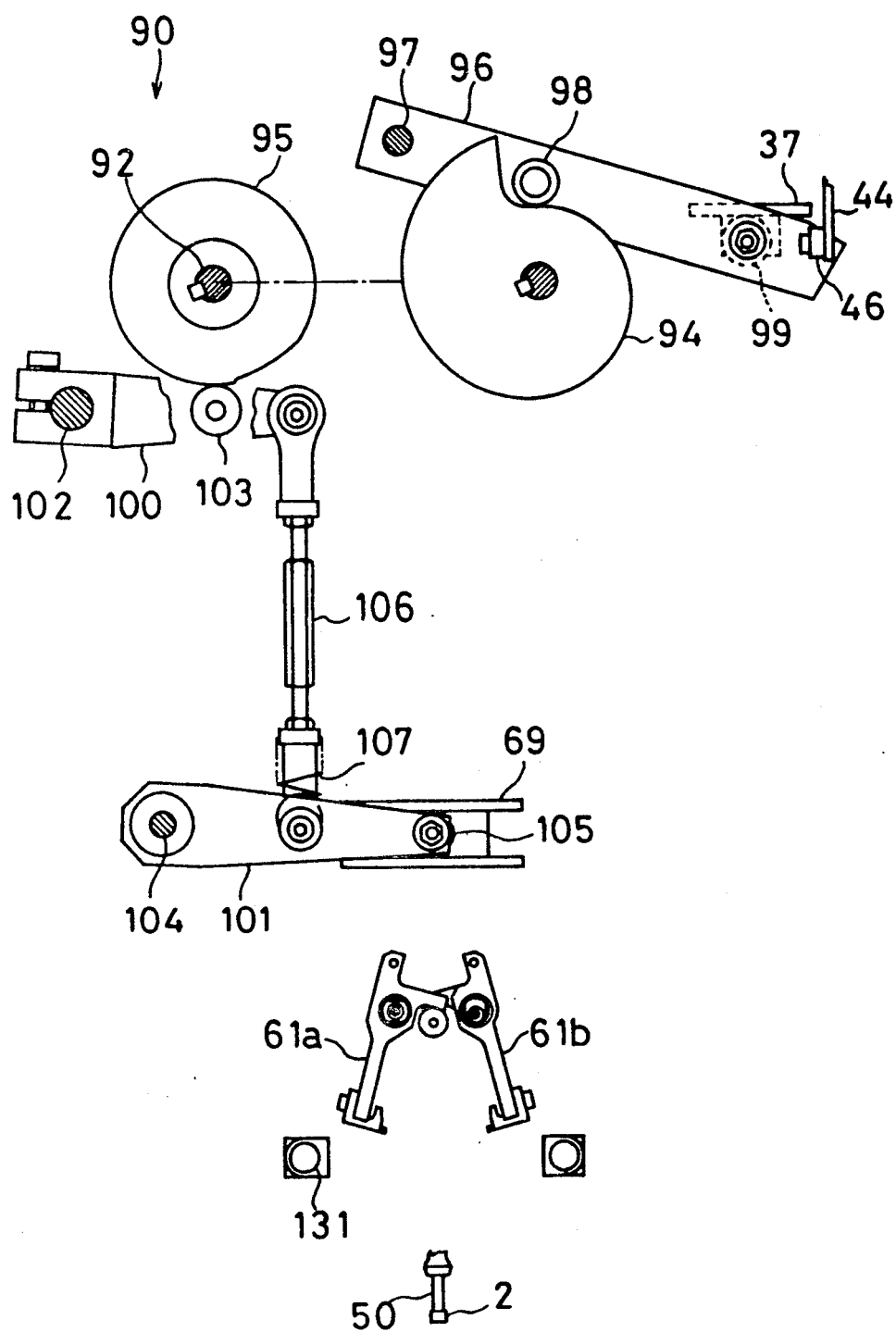
Figure 18:
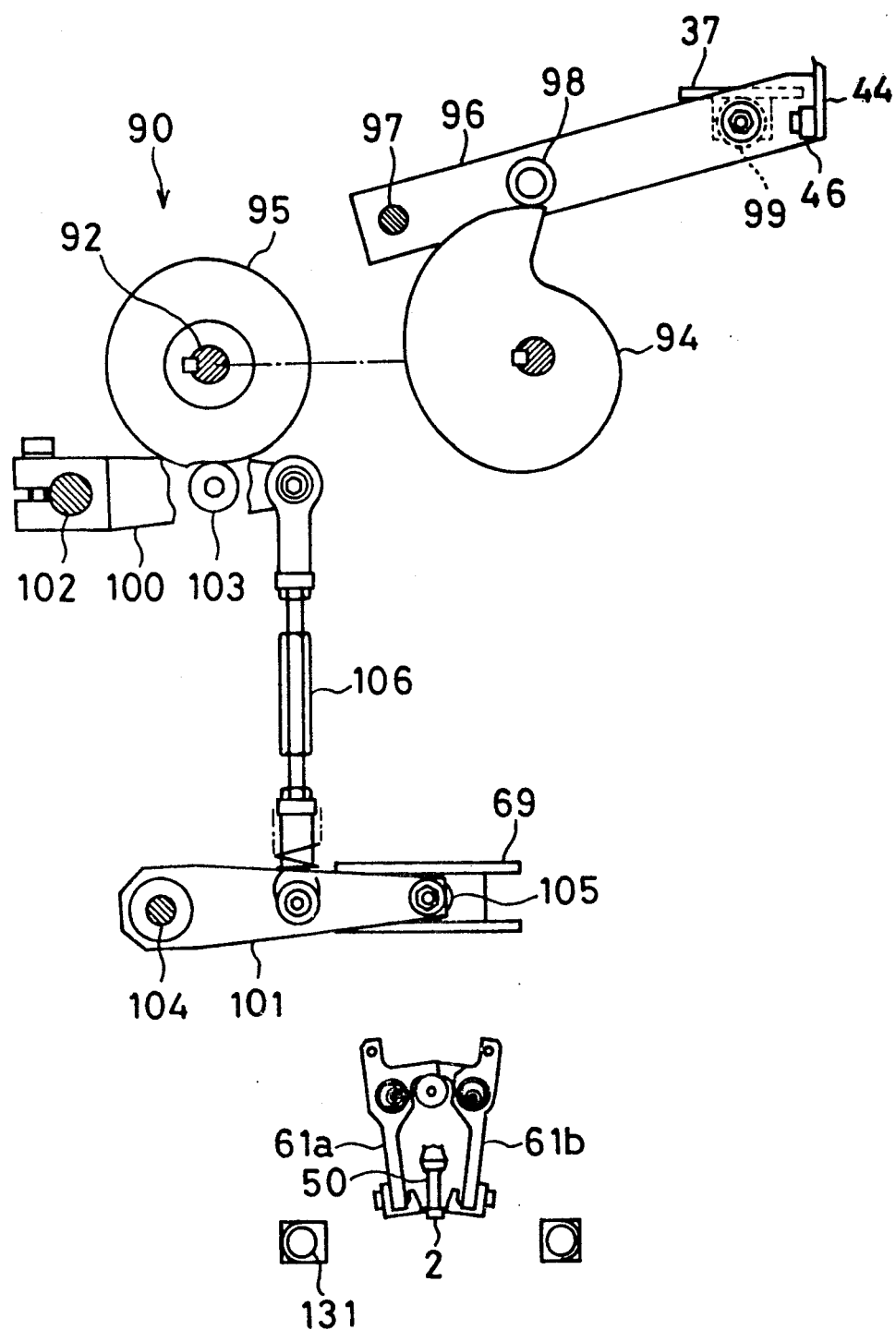

The parts positioning jaws 61a, 61b, 62a and 62b are provided with adjusting mechanisms for fine adjustment of the position of the swingable end, respectively. Description is made taking as an example the parts positioning jaws 61a and 61b with reference to FIGS. 14 and 15. Eccentric shafts 80 respectively constitute supporting shafts of the parts positioning jaws 61a and 61b. Each of the eccentric shafts 80 comprises a shaft center portion 81 fitted to the mount base 60, a first eccentric portion 82 located outside of the mount base 60, and a second eccentric portion 83. A bearing 84 is fitted on the outside of the first eccentric portion 82. The parts positioning jaws 61a and 61b are respectively supported through the bearing 84. The second eccentric portion 83 has a larger diameter than that of the first eccentric portion 82, to perform the function of preventing the bearing 84 from coming off. In addition, the second eccentric portion 83 has flat portions 85 on both sides so that it can be rotated by pinching the flat portions 85 using a spanner. The flat portions 85 are projected outward from a window 86 provided for a holder 78. The phases in eccentricity of the first eccentric portion 82 and the second eccentric portion 83 are the same. Accordingly, it is possible to judge the direction of the first eccentric portion 82 if the second eccentric portion 83 is viewed from the outside. The eccentric shaft 80 is fixed to the mount base 60 by a bolt 87 which penetrates the shaft center portion 81 and can be rotated by loosening the bolt 87. The effect brought about by the rotation of the eccentric shaft 80 will be described with reference to FIG. 14. The eccentric shaft 80 of the parts positioning jaw 61a is drawn is such a shape that the eccentric portions are oriented the horizontal direction. The rotation of the eccentric shaft 80 arranged in this shape, however, causes the parts positioning jaw 61a to be displaced mainly in the vertical direction. On the other hand, the eccentric shaft 80 of the parts positioning jaws 61b is drawn in such a shape that the eccentric portions are oriented the vertical direction. The rotation of the eccentric shaft 80 arranged in this shape, however, causes the parts positioning jaws 61b to be displaced mainly in the horizontal direction. Both of the pair of parts positioning jaws need not be thus provided with the adjusting mechanisms. A practical object can be achieved by only providing one of the pair of parts positioning jaws with the adjusting mechanism.

Cam device 90, shown in FIGS. 16 to 23, applies vertical motion to the spindle 31 and the flange cylinder 69. Reference numeral 91 denotes a frame of the cam device 90. A cam shaft 92 is rotatably supported in the horizontal direction on the frame 91. The cam shaft 92 is connected to a pulse motor 93 fixed to the frame 91, and two cams 94 and 95 are fixed to the outside thereof. Reference numeral 96 denotes a lever located above the cam shaft 92 and supported to be swingable in a vertical plane by a supporting shaft 97, which has in its intermediate part a cam follower roller 98 in contact with the cam 94 and, a roller 99 for supporting the flange 37 fixed to the spindle 31 is mounted on its free end. The lever 96 is in such a shape that two plates are placed in parallel with each other as viewed from above, and a tip end of one of the plates is fitted between the rollers 46 attached to the bracket 44 to stop the rotation of the ring 41. Levers 100 and 101 in the upper and lower two stages are arranged below the cam shaft 92. The lever 100 is supported by a supporting shaft 102 to be swingable in a vertical plane, and has in its intermediate part a cam follower roller 103 in contact with the cam 95. The lever 101 is supported by a supporting shaft 104 to be swingable in a vertical plane, and has in its free end a roller 105 engaged with the flange cylinder 69. A free end of the lever 100 and an intermediate part of the lever 101 are connected to each other by a turnbuckle type link 106. Reference numeral 107 denotes a tension coil spring connected to the lever 101 for pulling up the lever 101, which causes a force for bringing the cam follower roller 103 into contact with the cam 95 to be also produced in the lever 100.

Figure 6:
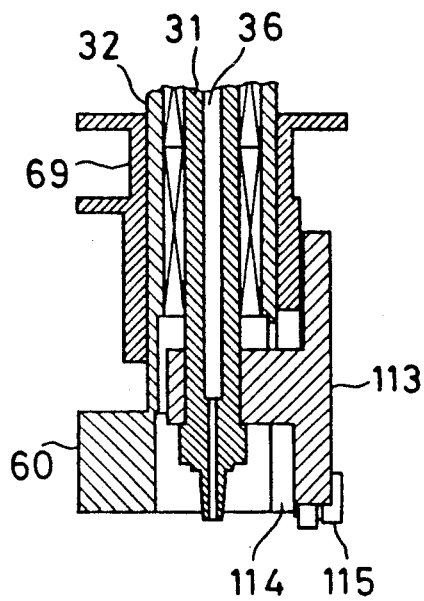
FIG. 6 is a partially sectional view showing a portion of the head portion cut by a flat surface different from that in FIG. 3.
Figure 7:
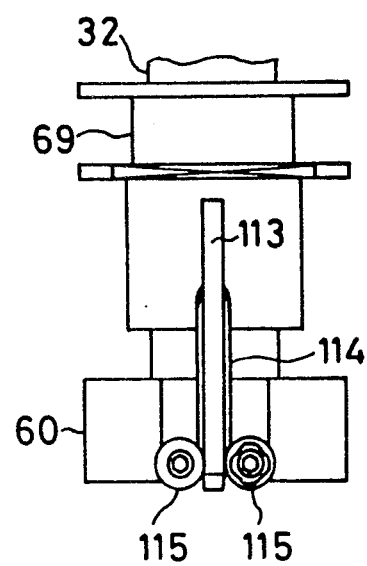
FIG. 7 is a front view showing the portion shown in FIG. 6.
Figure 20:
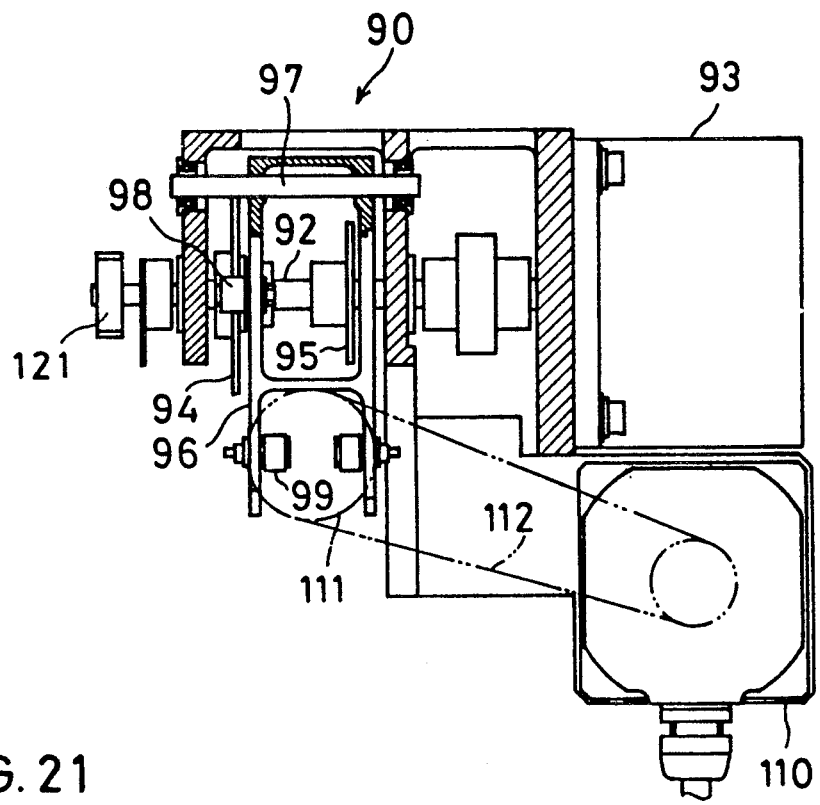
FIGS. 20 to 22 are horizontal sectional views showing the structure of a cam device and a lever associated therewith.
Figure 21:
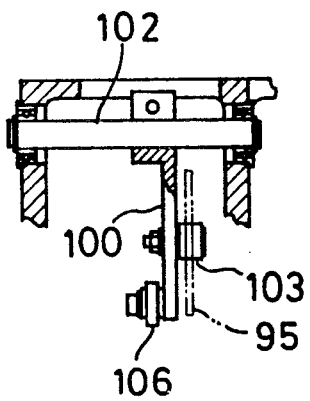
Figure 22:
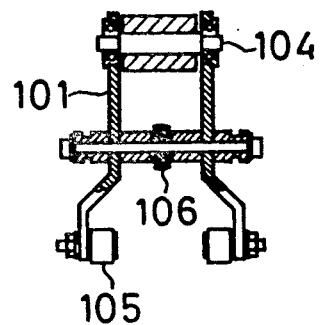

Reference numeral 110 shown in FIG. 20 denotes an AC servomotor fixed to the frame 91, which performs the function of transferring rotation to a timing pulley 111 fixed to the hollow shaft 32 through a timing belt 112. The rotation of the hollow shaft 32 is transferred to the spindle 31 by the mechanism shown in FIGS. 6 to 8. More specifically, a transfer piece 113 is fixed to the spindle 31, and the transfer piece 113 extends outward through a slit 114 formed at a corner of the mount base 60. The transfer piece 113 which extends outside of the hollow shaft 32 is sandwiched between a pair of rollers 115 rotatably supported on the mount base 60. In order to maintain the transfer of the rotation of the hollow shaft 32 irrespective of whether the spindle 31 is located in the upper portion or the lower portion, a portion, which is located outside of the mount base 60, of the transfer piece 113 has a considerable length in the vertical direction. Meanwhile, in order to eliminate backlash in the direction of rotation between the hollow shaft 32 and the spindle 31, an adjusting mechanism by an eccentric shaft is used for one of the rollers 115 to be slightly moved in the lateral or horizontal direction, as in the case of the positioning jaws.

Figure 23:
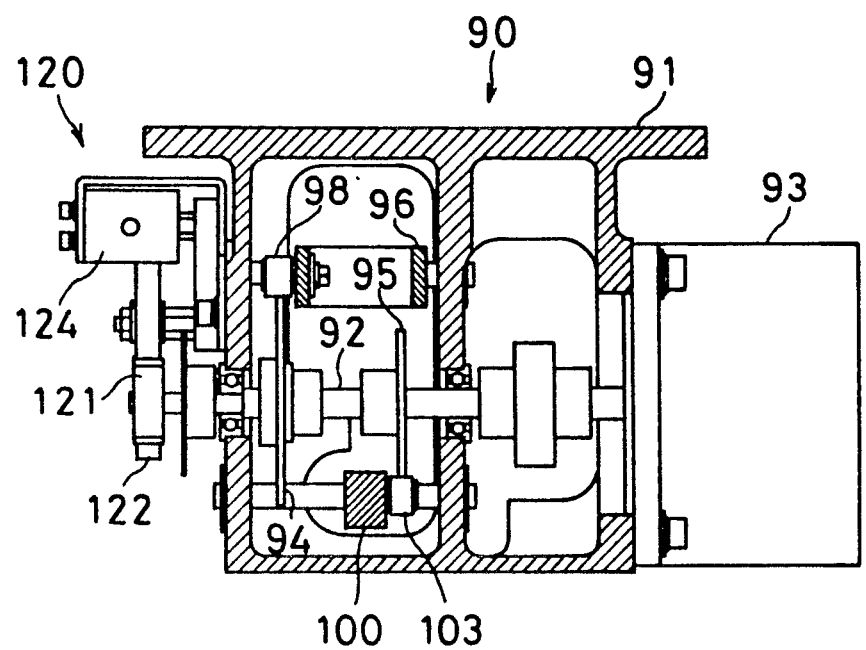
FIG. 23 is a cross sectional view showing a brake mechanism.
Figure 24:
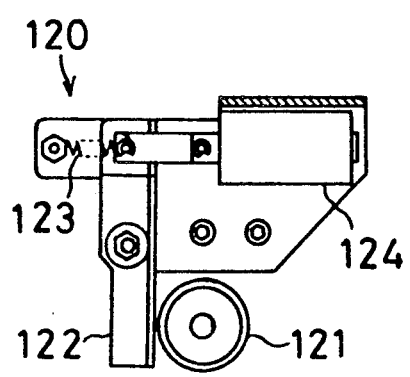
FIGS. 24 and 25 are partially front views showing the structure and an operation of the brake mechanism.
Figure 25:
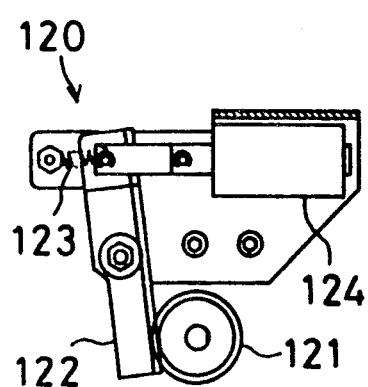

Reference numeral 120 shown in FIG. 23 denotes a brake mechanism provided for the cam shaft 92. The brake mechanism 120 has as its major constituent elements a brake wheel 121 fixed to the cam shaft 92, a brake shoe 122 swingably mounted on the frame 91, a spring 123 for bringing the brake shoe 112 into contact with the brake wheel 121, and a solenoid 124 for pulling the brake shoe 122 in the direction contrary to the urging force of the spring 123. Each of the brake wheel 121 and the brake shoe 122 is constituted by a pinion and a rack. A current flows through the solenoid 124 at the same time that electric power is supplied to the parts mounting apparatus 10, to separate the brake shoe 122 from the brake wheel 121, as shown in FIG. 24. When the supply of electric power to the parts mounting apparatus 10 is stopped, the brake shoe 122 comes into contact with the brake wheel 121, as shown in FIG. 25, to stop the rotation of the cam shaft 92.

A frame 130 having a rectangular shape is fixed to a lower end of the frame structure 34. Lightning units 31 are respectively mounted on opposed two sides of the frame 130 so as to illuminate the center of the frame 130. Each of the lighting units 131 is constituted by a cold cathode ray tube.

Nozzle Replacing Portion

The nozzle replacing portion 140 always holds a plurality of types of nozzles and replaces the nozzle in the lower end of the spindle 31 depending on the type of parts. However, the mechanism of the nozzle replacing portion 140 is not the gist of the present invention and hence, the description thereof is omitted. Mechanisms as described in the above described Japanese Patent Laid-Open Gazette Nos. 59-69992, 63-16700, 1-121138 and the like can be employed. This nozzle is roughly divided into two types, that is, the normal type nozzle 50 as shown in FIGS. 10 to 13 and a nozzle for image recognition 141 shown in FIG. 19. The nozzle for image recognition 141 is used for handling parts, whose position is determined by image recognition, such as a flatpack IC and has a horizontal background plate 142 above a parts sucking portion. The background plate 142 is made of transparent plastic rectangular in plane shape and has a special reflecting layer 143 provided on its upper surface. Light incident from an edge portion of the background plate 142 is scattered and reflected by the interface of the background plate 142 and the reflecting layer 143 and is produced from the lower surface of the background plate 142.

Conveyer Portion

The conveyer portion 150 has a fixed rail portion 151 and a movable rail portion 152. "Movable" of the movable rail portion 152 means that the distance between the movable rail portion 150 and the fixed rail portion 151 can be adjusted. Both the fixed rail portion 151 and the movable rail portion 152 respectively have belts 153 on their inner surfaces, thereby to convey the circuit board 1. Positioning means for stopping the circuit board 1 at a constant position is provided in the middle of the conveyer portion 150 but is not shown.

Board Supporting Portion

The board supporting portion 160 is used for supporting the circuit board 1 positioned in the conveyer portion 150 from the underside such that the circuit board 1 is not deflected even if the spindle applies pressure. It is possible to employ the same mechanism as that described in Japanese Patent Laid-Open Gazette No. 59-29492.

First Parts Feeding Portion

The first parts supporting portion 170 is constituted by a plurality of parts feeding modules 171 arranged in a line. Each of the parts feeding modules 171 is used for feeding normal surface mounting parts 2 (a chip capacitor, a chip resistor and the like) shown in FIGS. 10 to 12, and delivers from a reel 172 a tape having the parts 2 sealed therein and feeds the parts 2 one at a time. It is possible to employ as the parts feeding module 171 one described in Japanese Patent Publication No. 62-52960.

Second Parts Feeding Portion

The second parts feeding portion 180 has as its main part a cabinet 181 placed beside the base 11 and also has as a part of its constituent elements a positioning portion 182 located on the base 11 in line with the nozzle replacing portion 140. The cabinet 181 is equipped with a rectangular coordinate type robot 183. The rectangular coordinate type robot 183 picks up multiple lead parts 3 (see FIG. 19) such as a flatpack IC from tray (not shown) in the cabinet 181 and places the same in the positioning portion 182. In the positioning portion 182, a plurality of jaws push the multiple lead parts 3 so as not to bend leads, to roughly position the same. Then, the head portion 30 approaches the positioning portion 182, to pick up the multiple lead parts 3.

Image Sensing Portion

The first image sensing portion 191, the second image sensing portion 192 and the third image sensing portion 193 are all mainly composed of an industrial television camera. The first image sensing portion 191 and the second image sensing portion 192 are attached to the head portion 30. The first image sensing portion 191 is used for recognizing a fiducial mark printed on the circuit board 1, and the second image sensing portion 192 is used for recognizing a foot pattern similarly printed on the circuit board 1 (a land pattern to which the leads of the multiple lead parts 3 are soldered). The third image sensing portion 193 is located beside the positioning portion 182 in such a configuration as to look upward and is used for recognizing the multiple lead parts 3 sucked by the nozzle for image recognition 141.

Control Portion

An automatic control system of the parts mounting apparatus 10 is as shown in FIG. 2. Reference numeral 200 denotes a main unit control portion, which has as its center a central processing unit 201. A memory 202, a CRT 203 and a keyboard 204 are appended to the central processing unit 201. The central processing unit 201 controls a lighting controller 206, an X-Y stage controller 207, a head portion controller 208, a nozzle replacing portion controller 209, a conveyer portion controller 210, a board supporting portion controller 211 and a parts feeding portion controller 212 through a bus line 205. The lighting controller 206 controls a lighting portion 213. This lighting portion 213, however, is the collective name of lighting portions respectively combined with the first image sensing portion 191, the second image sensing portion 192 and the third image sensing portion 193, which also includes the lighting units 131.

There is a recognizing portion 220 in addition to the main unit control portion 200. The recognizing portion 220 comprises a central processing unit 221, a memory 222 and a CRT 223 both appended to the central processing unit 221, an A/D converting portion 225 connected to the central processing unit 221 through a bus line 224, and an image processing portion 226. The A/D converting portion 225 is connected to the first image sensing portion 191, the second image sensing portion 192 and the third image sensing portion 193. In addition, the central processing unit 221 is connected to the central processing unit 201 in the main unit control portion 220 through a communication line 230. A communication line 231 to external equipments is also connected to the central processing unit 201.

Operation

Before the operation of the parts mounting apparatus 10 is started, the spindle 31 is in its raised position and the brake shoe 122 is in contact with the brake wheel 121. If electric power is supplied to drive the parts mounting apparatus 10, the solenoid 124 is operated, to separate the brake shoe 122 from the brake wheel 121, allowing the cam shaft 92 to be rotated. Thereafter, the picking and placing work of parts is started. First, description is made assuming that the normal type nozzle 50 is mounted on the spindle 31. Simultaneously with the start of the work, the X-Y stage 20 causes the head portion 30 to be moved onto an arbitrary parts feeding module 171 in the first parts feeding portion 170. At this time, when the pulse motor 93 causes the cam shaft 92 to be rotated in the clockwise direction in the drawings from the cam angular position shown in FIG. 18 to an angular position shown in FIG. 16, the free end of the lever 96 is lowered and the spindle 31 is lowered, so that the nozzle 50 sucks the parts 2. In addition, the free ends of the levers 100 and 101 are also lowered, and the flange cylinder 69 is lowered. As a result, the parts positioning jaws 61a, 61b, 62a and 62b are opened outward. When the cam shaft 92 is rotated in a counter-clockwise direction after the parts 2 are sucked, the spindle 31 is raised along with the parts 2. The flange cylinder 69 is not moved until the nozzle 50 reaches the height shown in FIG. 17 according to a cam curve between the cams 94 and 95. When the nozzle 50 reaches the height shown in FIG. 17, the rise of the spindle 31 is stopped irrespective of the rotation of the cam shaft 92. Alternatively, the flange cylinder 69 starts to be raised. The parts positioning jaws 61a, 61b, 62a and 62b are closed, to bring the parts 2 close to the center of the nozzle 50. When the parts positioning jaws sandwich the parts 2, they are not further closed. However, the excessive stroke of the flange cylinder 69 after that is absorbed by the extension of the tension coil spring 70 (see FIG. 12). The AC servomotor 110 causes the hollow shaft 32 to be rotated to orient the parts 2 in a predetermined direction subsequently to or simultaneously with centering of the parts 2. While these operations are performed, the X-Y stage 20 causes the head portion 30 to be moved to a predetermined coordinate position on the circuit board 1. The circuit board 1 is coated with adhesives in a parts mounting position in the previous process (by screen process printing or a dispenser) and is positioned in the conveyer portion 150. Furthermore, the shift in position of the circuit pattern on the circuit board 1 is checked by the first image sensing portion 191 recognizing the fiducial mark and is corrected during the movement of the X-Y stage 20. When the spindle 31 is lowered to shift the parts 2 to the circuit board 1, one cycle of the picking and placing work is terminated. When the positioning precision of the parts positioning jaws 61a, 61b, 62a and 62b is decreased by, for example, wear of the jaw chips 63 and 64, the eccentric shaft 80 is rotated to recover the precision.

Figure 19:
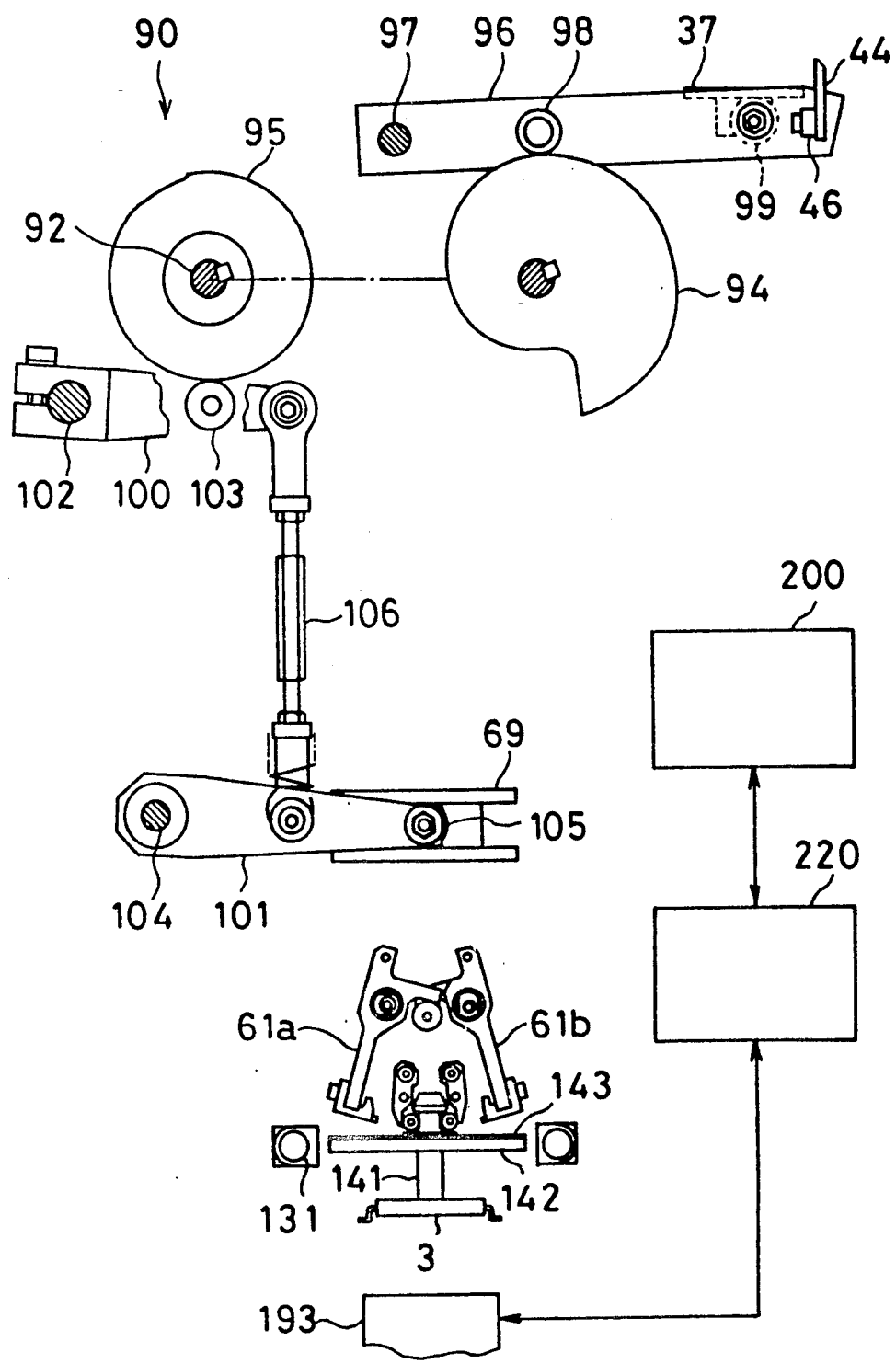

When the multiple lead parts 3 are mounted using the nozzle for image recognition 141, the rise of the spindle 31 is stopped short of the upper limit of the stroke, that is, in a state shown in FIG. 19. In this state, the nozzle for image recognition 141 is outside of the operating region of the parts positioning jaws 61a, 61b, 62a and 62b. More specifically, the CPU 201 outputs a nozzle replacing signal to the nozzle replacing portion controller 209 in response to a signal representing that the parts mounting operation using the normal nozzle 50 is completed so that the nozzle for image recognition 141 is attached to the spindle 31 in place of the normal nozzle 50. Thereafter, the CPU 201 outputs a signal to the head portion controller 208 so as to stop the rotation of the pulse motor 93 for rotating the cam shaft 92 in the counterclockwise direction before the spindle 31 reaches the upper limit of the stroke. Therefore, the parts positioning jaws 61a–61b are not closed.

At this time, the background plate 142 is at the same height as that of the lighting unit 131. When the lighting unit 131 lights up, light from the lighting unit 131 first enters the edge portion of the background plate 142, and the direction of the light is changed downward by the reflecting layer 143, to silhouette the multiple lead parts 3. The head portion 30 in this state is placed on the third image sensing portion 193, to check the shift of the multiple lead parts 3 from the nozzle for image recognition 141. Thereafter, the head portion 30 is moved onto the circuit board 1, to be overlapped with the foot pattern checked by the second image sensing portion 192 with the shift being corrected.

Even if electrical power fails during the picking and placing work, the rotation of the cam shaft 92 is stopped by the brake mechanism 120. Accordingly, the spindle 31 is not dropped, so that the circuit board 1 is not damaged and the nozzle is not harmed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A parts mounting apparatus, comprising:
    a spindle vertically held and having a vacuum suction path inside;
    a group of nozzles selectively mounted on a lower end of said spindle and made to have communication with said vacuum suction path;
    a nozzle for image recognition included in said group of nozzles;
    parts positioning jaws supported on a structure for centering parts sucked by a normal nozzle with their tips, said structure supporting said spindle being able to move upward and downward;
    first means for applying to said spindle vertical motion for picking and placing the parts;
    second means for opening and closing said jaws; and
    third means for preventing the jaws from performing the centering operation.

2. A parts mounting apparatus in accordance with claim 1, wherein said first means includes means for applying a vertical motion to said spindle to put the nozzle on said spindle in the working area of said jaws when the spindle is lifted, and said third means includes means for stopping the ascent of said spindle before the nozzle on the spindle enters the working area of said jaws when said nozzle for image recognition is used.

3. A parts mounting apparatus in accordance with claim 2, wherein said first means includes a cam device for applying said vertical motion to said spindle and for making said jaws move, and a motor for driving said cam device, and said third means includes control means for controlling said motor to stop the ascent of said nozzle for image recognition before it enters the working area of said jaws.

4. A parts mounting apparatus in accordance with claim 2, wherein said nozzle for image recognition includes a background plate above its lower end, said plate changing the direction of light entering horizontally from its edge downward; and a lighting unit supported on the structure, said unit being placed where it projects said light horizontally toward the edge of said background plate when said nozzle for image recognition is stopped below said working area of said jaws.

5. A parts mounting apparatus in accordance with any one of claims 1 to 4, wherein said structure for supporting said spindle can move within a plane.

6. A parts mounting apparatus in accordance with claim 5, further comprising an image sensing means above which said structure moves; and an image recognition means to receive image information from said image sensing means and to perform image recognition such that parts position can be adjusted on the basis of the result of said image recognition.

* * * * *